United States Patent [19]

Angelopolus et al.

[11] Patent Number: 5,300,403
[45] Date of Patent: Apr. 5, 1994

[54] LINE WIDTH CONTROL IN A RADIATION SENSITIVE POLYIMIDE

[75] Inventors: Marie Angelopolus, Briarcliff Manor; Daniel G. Berger; Eric D. Perfecto, both of Wappingers Falls; Peter J. Wilkens, Yorktown, all of N.Y.

[73] Assignee: International Business Machines Corporation, Armonk, N.Y.

[21] Appl. No.: 900,975

[22] Filed: Jun. 18, 1992

[51] Int. Cl.$^5$ ................................ G03C 5/00
[52] U.S. Cl. .................... 430/325; 430/327; 430/328; 430/330; 430/4; 430/5
[58] Field of Search ........... 430/325, 327, 328, 330, 430/4, 5

[56] References Cited

U.S. PATENT DOCUMENTS

| | | |
|---|---|---|
| 4,670,535 | 6/1987 | Sugio et al. |
| 4,778,859 | 10/1988 | Ai et al. |
| 4,820,612 | 4/1989 | Mase et al. |
| 4,828,967 | 5/1989 | Mase et al. |
| 4,877,718 | 10/1989 | Moore et al. |
| 4,968,581 | 11/1990 | Wu et al. |
| 4,980,268 | 12/1990 | Bartmann et al. |
| 5,001,039 | 5/1991 | Ogoh |
| 5,122,440 | 6/1992 | Chien |

FOREIGN PATENT DOCUMENTS 272870 12/1984 Japan.

OTHER PUBLICATIONS

John C. Matthews et al., Stabilization of single layer and multilayer resist patterns to aluminum etching environments, SPIE Conference, Mar. 1984.

Primary Examiner—John Kight, III
Assistant Examiner—Duc Truong
Attorney, Agent, or Firm—Whitham & Marhoefer

[57] ABSTRACT

Standard processing techniques for creating a patterned polyimide film from a radiation sensitive polyimide film forming composition are modified to include a post-develop, flood exposure/hardening step which cross-links precursors of the polyimide film prior to curing. The flood exposure/hardening step prevents pull-back of the wall profile which occurs during the shrinkage of radiation sensitive polyimide film forming composition which occurs during thermal curing.

16 Claims, 1 Drawing Sheet

LINE WIDTH CONTROL IN A RADIATION SENSITIVE POLYIMIDE

BACKGROUND OF THE INVENTION

1. Field of the Invention

The invention is generally related to a method for processing radiation sensitive polyimide film precursors and, more particularly, to a method of processing which allows for better retention of the sidewall profile of trenches and the like created in is a film of the polyimide precursors during imaging and developing subsequent to the shrinkage which occurs during imidization.

2. Description of the Prior Art

Polyimide materials are used in a wide variety of semiconductor and integrated circuit applications. These materials can serve as insulating layers between active devices and conductive lines, as carrier layers in multilayer structures, as well as fulfill a wide variety of other functions. Of particular importance in the electronics industry are polyimides based on 3,3',4,4'-biphenyl tetracarboxylic acid dianhydride (BDPA) and p-phenylene diamine (PDA). These polyimides, as well as some others, possess several important properties for integrated circuit and semiconductor manufacturing, including low solvent uptake, low thermal coefficient of expansion (TCE), and high glass transition temperature (Tg) (>325° C.).

The properties that make certain polyimides highly desirable for integrated circuit and semiconductor manufacturing (e.g., high Tg, low TCE, and solvent resistance), also make them difficult to process and pattern. In order to reduce processing steps, efforts have been made to directly pattern radiation sensitive polyimide precursors. For example, U.S. Pat. No. 4,670,535 and U.S. Pat. No. 4,778,859 both disclose photopatterning polyimide precursors.

Both positive and negative working radiation sensitive polyimide precursors have been used in prior art semiconductor devices. U.S. Pat. No. 4,877,718 to Moore et al. discloses a positive-working photosensitive polyimide wherein exposure to a pattern of light renders the exposed areas soluble. Moore et al. further discloses that the exposed areas can then be dissolved using a solvent to leave a pattern which can be used directly as an insulator layer in a semiconductor device. U.S. Pat. Nos. 4,820,612 and 4,828,967 to Mase et al. both show applying a negative-working photosensitive polyimide precursor layer to a semiconductor substrate followed by exposing, developing, and curing to create an insulative layer which is used on the substrate.

The chief advantage of using radiation sensitive polyimide precursors (polyamic acid derivatives) for polyimide film formation is that a stencil is created from a single expose/develop procedure which defines a permanent dielectric insulator. The stencil is subsequently filled with metallization for the electrical conductor and signal lines that make up the integrated circuit package, and no secondary materials or secondary etching steps are required.

A significant disadvantage of using radiation sensitive polyimide precursors for polymer film formation is that a tremendous amount of uncontrolled shrinkage occurs when the photocomponents (e.g., solvents, photoreactive groups, etc.) are driven out during the final imidization cure. The final imidization step assures that the final film has all the properties of a good non-radiation sensitive polyimide material.

A number of photoresist processing techniques have been developed which include ultraviolet (uv) exposure steps for patterning or otherwise affecting photosensitive polyimides. For example, U.S. Pat. No. 4,968,581 to Wu et al. discloses a high resolution photosensitive polyimide wherein deep uv and excimer laser exposure is used to create positive and negative tone images. U.S. Pat. No. 4,980,268 to Bartmann et al. discloses negative photosensitive polyimides which contain 1,2-disulfone moieties as the photoinitiator.

In addition, a number of photoresist processing techniques have been developed which include a post-develop UV exposure step designed to stabilize the photoresist (non-polyimide resists) during subsequent processing. Specifically, Matthews et al., *SPIE Conference, Optical Microlithography III*, Santa Clara, Calif., Mar. 14–15, 1984, disclose the stabilization of single layer and multilayer resist patterns to aluminum etching environments. In particular, the Matthews article discloses a first UV exposure step for patterning and a second, post-develop, exposure step to intense UV radiation while increasing the wafer temperature from 100° C. to 200° C. The second or post-develop exposure step with temperature increase is said to enable several common positive photoresists to withstand higher temperatures and planar plasma etching with aluminum. In addition, U.S. Pat. No. 5,001,039 to Ogah et al. discloses a method of manufacturing semiconductor devices wherein a photoresist layer is exposed, developed, and then exposed to uv again prior to heat treatment. As explained in Ogah et al., the second uv exposure step crosslinks the surface of the photoresist material and provides a "hardening" property that prevents drooping at the bottom of the photoresist pattern.

The UV exposure techniques described for photoresists are not directly translatable to radiation sensitive polyimides, such as photosensitive polyimides, used as carrier or insulative layers. Resists are usually on the order of a few microns, whereas radiation sensitive polyimide materials are typically used to create films on the order of twenty microns. Moreover, the "hardening" step for photoresists described in the prior art is merely limited to the surface regions of the resist, not the bulk of the film. With radiation sensitive polyimide precursors, temperatures of approximately 400° C. are used to imidize the precursors into a polyimide film. Photoresists are generally not designed to withstand these extreme conditions, even if they are "hardened" as suggested by the prior art. Furthermore, during curing, polyimide materials undergo massive shrinkage on the order of 50% or more, whereas photoresists do not shrink to this magnitude upon heating. Therefore, surface hardening is all that is required for photoresist materials, but it would not be adequate for photosensitive polyimides. Lastly, the surface hardening steps performed with photoresist materials is designed to prevent droop of the photoresist. Specifically, the photoresist tends to melt or sag at higher temperatures and under harsh conditions, and this tends to narrow a trench opening in the photoresist at its bottom. Conversely, radiation sensitive polyimide materials do not "flow" like a photoresist, so closing off at the bottom of a trench is not a problem (e.g., the bottom of a trench is relatively fixed with polyimide materials).

SUMMARY OF THE INVENTION

It is therefore an object of this invention to provide an improved method of processing radiation sensitive polyimide forming materials which maintains the sidewall profile of trenches and the like created during exposure and development subsequent to the thermal imidization reaction which creates the polyimide.

According to the invention, a post development radiation exposure step prior to thermal curing has been found to maintain the sidewall profile of trenches and the like formed in a polyimide precursor film. This radiation exposure step increases the cross-linking density of the already exposed/developed polyimide precursor film. The increased cross-linking density "hardens" the radiation sensitive polyimide precursors thereby making the system more resistant to volume collapse upon thermal curing. Hence, even though substantial z-axis shrinkage of the polymeric film occurs during imidization due to the photopackage, solvents, and other compounds being burned off, the sidewall profile of various features remains stable (e.g., the x-y shrinkage is greatly improved). Therefore, the electronic characteristics of the metallization lines formed in the trenches will be more dependable than has been the case with prior art processing techniques.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
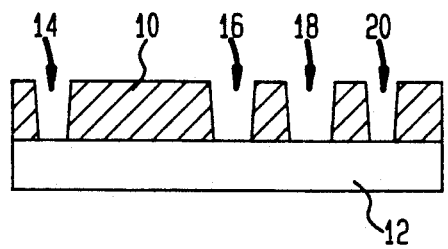
FIGS. 1a and 1b are sequential cross-sectional side views of a patterned radiation sensitive polyimide film forming material prior to and after imidization, respectively.

In microelectronic circuit manufacturing, radiation sensitive polyimide film forming materials for creating insulative and carrier layers generally include polyimide precursors (polyamic acid derivatives) dissolved in an organic solvent together with a radiation sensitive initiator and sensitizer. Many times the polyimide composition used in microelectronic circuit applications include, for example, BPDA and PDA which are used in making the well known BPDA-PDA polymer. In addition, the polyimide precursors are polyamic acid derivatives (esters or salts) which include a covalently or ionically bonded crosslinkable moiety, such as, for example, an acrylate or methacrylate group. The polyamic acid derivative could be from 5 to 100% functionalized with the cross-linkable groups. In addition, radiation sensitive groups can be used in conjunction with non-radiation sensitive groups such as acrylate ester/methyl ester or acrylate salt/methyl salt in various combinations.

The function of the crosslinkable moiety is to react, upon exposure to radiation, such as, for example, by UV radiation, electron beam, x-rays, ion beams, visible light, or the like. Crosslinking occurs when radiation exposure causes the initiator to generate radicals which initiate crosslinking between the cross-linkable moieties connected to the polyimide precursors. Depending on whether the radiation sensitive polyimide film forming materials have a positive or negative tone, the areas exposed to radiation will either become more or less soluble. A developing solution is then used to remove the soluble portions to leave a stencilled pattern of the radiation sensitive polyimide film forming materials.

In the prior art, subsequent to development, the polyimide precursors are imidized by high temperature thermal curing. During thermal cure, the solvents, initiators, sensitizers, and covalently or ionically bonded crosslinking moieties, all of which are sometimes collectively referred to as the "photopackage", are burned off. This leads to a tremendous amount of direction z shrinkage exceeding 50%. Burning off the photopackage during the imidization reaction is essential for obtaining the desirable qualities of a nonradiation sensitive polyimide film (e.g., low TCE, high Tg, and solvent resistance).

The shrinkage that occurs during imidization must be planned for in any integrated circuit or semiconductor manufacturing process which employs radiation sensitive polymide film forming materials. However, the inventors have observed an unusual problem associated with the shrinkage that cannot be easily compensated for which this invention specifically addresses.

In the prior art processing regime, a radiation sensitive polyimide film forming layer is applied to a substrate (e.g., spincoating or the like). Prior to radiation exposure it is baked (sometimes called a soft bake) to get rid of solvents. Soft baking is typically performed between 70 and 120° C. for thirty seconds to twenty minutes or more. The polyimide film forming layer is then exposed to radiation in a prescribed pattern, such as by UV lamp. As an example, photoexposure can be performed in a projection, proximity or contact printer with broad band (BB) exposure or using a G-line filter with about 10 mJ to 1 J dosage. After exposure, for some radiation sensitive polyimide film forming layers, a post exposure bake may be performed to continue the crosslinking. Subsequently, the film forming layer is developed to provide a stencil pattern. Developing is typically done with an organic solvent such as ethyl acetate, N-methyl-2-pyrrolidinone (NMP), 2-methoxyethylether, xylene, γ-butyrolactone, or alcohols for a time ranging from 10 seconds to five minutes or more. Finally, the film forming layer is subjected to a thermal cure which imidizes the precursors into an insulative film. As explained above, imidization is typically performed at approximately 400° C. and burns off the photopackage to produce a polyimide film of suitable quality.

Figure 1B:
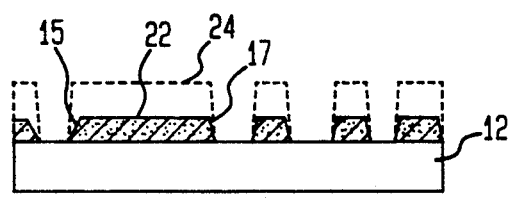

FIGS. 1a and 1b highlight the problem with the prior art regime. Figure 1a shows a radiation sensitive polyimide film forming material 10 deposited on substrate 12. In the material 10 are trenches 14, 16, 18, and 20 that are created by the exposure/development steps described above. Trench 14 constitutes an isolated feature since it is separated from the other trenches. Trenches 16, 18, and 20 constitute dense features because they are relatively close together. As an example, dense features could be uniform and spaced on the order of 20–100 microns apart, whereas isolated features are Separated by greater than 100 microns. FIG. 1b shows that upon thermal curing, the thickness of the polyimide film 22 is greatly reduced from the polyimide film forming material layer shown as dotted line 24. Furthermore, the problem discovered by the inventors is that the slope of the sidewalls of trench 14 is far greater than for the sidewall slopes in trenches 16, 18, and 20. This is particularly illustrated by contrasting slope 15 with slope 17. Hence, the density of the pattern has a direct effect on the wall angle of the imaged and cured polyimide. Usually the substrate 12 is another polyimide or some other material, and, because there is almost no flow of the polyimide film forming layer 24 during imidization, the bottom portion of the trenches 14, 16, 18, and 20 remains relatively unchanged, whereas the top dimension pulls back.

After metallization is deposited in the trenches 14, 16, 18, and 20, it can be seen that by measuring the line width of the isolated features and the dense features at the top surface of the polyimide film 22, the isolated features (e.g., trench 14) have a larger width than the dense features (trenches 16, 18, and 20) because of sidewall sloping problem. Therefore, two identically sized lines running next to each other in one area can become differently sized when they diverge depending on whether the lines become isolated features or dense features. This large variation in feature size has a very negative impact on the electrical signal propagation properties of the package.

In the invention, the processing regime is modified by adding a flood exposure step after the -development step and prior to thermal curing. In the flood exposure step, the developed polyimide film forming layer is subjected to radiation, such as UV/visible radiation, electron beam, ion beam, x-rays or the like for an extended period of time. For example, the flood exposure time period could range up to one hour or more and the exposure dose could range from 200 mJ to 10 J. Particularly good results can be obtained at a dose of 3 J. It has been found to be advantageous to heat the structure containing the polyimide film forming materials during the flood exposure step. For example, the structure could be baked on a hot plate or by infra red heating at a temperature on the order of 70°-175° C., and most preferably between 80°-120° C., throughout the flood exposure step or for some portion of the time during the flood exposure step. After the flood exposure step, the radiation polyimide film forming layer is converted to a polyimide layer by thermal curing.

Figure 2:
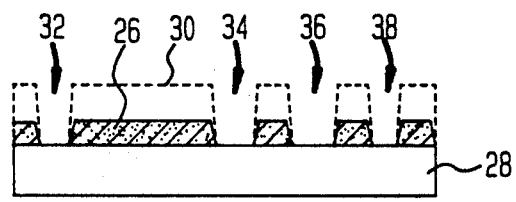
FIG. 2 is a cross-sectional side view of a patterned polyimide film which has been pretreated with a flood radiation hardening prior to imidization.

FIG. 2 shows a polyimide film 26 created on substrate 28 according to the new processing regime. Like in FIG. 1b, the polyimide film 26 is significantly thinner than the developed radiation sensitive film forming layer 30 indicated by dotted lines. However, unlike in FIG. 1b, the sidewall profile of the isolated trench 32 is the same or approximately the same as dense feature trenches 34, 36, and 38. Unlike the exposure step used for patterning the radiation sensitive polyimide film forming materials where the exposure is sufficient to initiate crosslinking polymerization of some of the polymer precursors such that the solubility of the exposed portions is changed relative to the unexposed portions, the post development flood exposure step provided by this invention extensively increases the cross-linking density of the system and, thereby provides a built-in shape retention feature that will assure that the side wall profile of various trenches stays the same. The flood exposure step is designed to react the bulk, not just the surfaces, of the polyimide film forming stencil 30 which is subsequently subjected to high temperature curing at 400° C. to form polyimide 26.

A wide variety of polyimide film forming materials can be used in the practice of this invention. For effective use in microelectronic circuitry, the Polyimide precursors should produce a polyimide film with low TCE, high Tg, and solvent resistance.

Particularly good polyimide precursors include tetracarboxylic acid dianhydrides and diamines which react to form polymers such as BPDA-PDA. In addition, fluorinated diamines and/or fluorinated tetracarboxylic acid dianhydrides may also be used, as is described in the pending U.S. patent application having Ser. No. 07/782,923, filed on Oct. 25, 1992 which is herein incorporated by reference.

Examples of tetracarboxylic acid dianhydrides are characterized by the following formula:

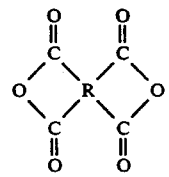

wherein R is a tetravalent organic radical selected from the group consisting of aromatic, aromatic heterocyclic, and substituted groups thereof. However, the more typical dianhydrides are those in which the R groups have at least 6 carbon atoms characterized by benzenoid unsaturation, i.e., resonating double bonds in an aromatic ring structure, wherein the four carbonyl groups of the dianhydride are each attached to separate carbon atoms and wherein the carbon atoms of each pair of carbonyl groups are directly attached to adjacent carbon atoms in a 6-membered benzenoid ring of the R group to provide a 5-members ring as follows:

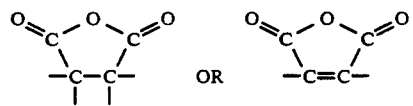

Examples of dianhydrides suitable for use in the present invention include: pyromellitic dianhydride; 2,3,6,7-Naphthalene tetracarboxylic dianhydride; 3,31,4,4'-biphenyltetracarboxylic acid dianhydride; 1,2,5,6-naphthalene tetracarboxylic dianhydride; 2,2',3,3'-biphenyl tetracarboxylic dianhydride; bis (3,4-dicarboxyphenyl) sulfone dianhydride; 3,4,3',4'-benzophenone tetracarboxylic dianhydride; terphenyl dianhydride; and mixtures thereof. The preferred tetracarboxylic acid gilanhydride is 3,3',4,4' biphenyl tetracarboxylic acid dianhydride (BPDA).

Examples of organic diamines are characterized by the formula:

wherein $R^1$ is a monocyclic or polycyclic aromatic organic diradical in which the aromatic rings may be aromatic, heterocyclic, or directly attached rings, e.g., biphenylene and naphthalene. The more typical $R^1$ groups in the diamines are those containing one or more rings, having 6 carbon atoms characterized by benzenoid unsaturation in each ring. Such R¹ groups include

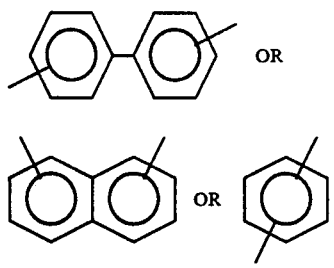

Specific examples of some diamines useful in the present invention include: p-phenylene diamine; 4,4'-diaminodiphenylamine; benzidine; 1,5-diaminonaphthalene; 3,3'-dimethyl-4,4'-diamino-biphenyl; 3,3'-dimethoxy benzidine; 1,4-bis(p-aminophenoxy) benzene; and 1,3-bis(p-aminophenoxy) benzene. The preferred diamine employed pursuant to the present invention is p-phenylene diamine (PDA).

The dianhydride and diamine should be selected such that when used together they would preferably provide a relatively rigid polyimide having a Tg of at least about 320° C. and more preferably at least about 350° C. Preferably, the dianhydride and diamines employed are free from bridged or linked radicals since these would give the polyimide an undesired degree of flexibility.

The polyimide precursors used in the practice of this invention should have some amount of crosslinkable moieties. These crosslinkable moieties will be acted upon during both the radiation patterning step which changes the solubility of exposed regions of the polyimide film forming materials and the radiation, post-develop, flood exposure which crosslinks additional crosslinkable units in the polyimide film forming materials such that the patterned shape is maintained. Commercially available photosensitive polyimide compounds include 6F available from Ciba-Geigy, Asahi TLX and pimel series, Toray photoneece, and Dupont PD4. As explained above, the polyimide precursors discussed above are modified to include unsaturated carbon-carbon double bond groups (e.g., acrylate moieties, etc.). The flood exposure step can be performed by exposing the stencil to all ultraviolet/visible wavelengths for a prescribed period of time (hence, the term "flood" exposure). Alternatively, wavelengths ranging between 300 nm and 500 nm could be used since these wavelengths are the ones primarily absorbed by acrylates. A polyimide precursor with a monoethylenically or monoacetylenically unsaturated group can be prepared directly by quaternization with an amine containing a vinyl group or monoacetylenically unsaturated group, respectively, such as dimethylaminomethylmethacrylate, and aminostyrene. Alternatively, an ester with a suitable monoethylenically or monoacetylenically unsaturated group can be prepared by reaction of typically about two moles of a substituted monoethylenically or monoacetylenically unsaturated compound containing an alcohol functionality with the dianhydride to form a half ester/acid monomer. Examples of suitable alcohols include hydroxyethylmethacrylate, hydroxypropylmethacrylate, hydroxyethylacrylate, and N-(hydroxymethyl) acrylamide, and propyl alcohol.

Combinations of radiation sensitive and non-radiation sensitive moieties may be used in polyamic acid derivatives, such as combinations of acrylate esters/methyl esters. It is expected that with more crosslinkable species present in the solution used to make the radiation sensitive polyimide film forming layer, there will be better side wall profile retention in the trenches.

The polyimide precursors are preferably dissolved or dispersed in an organic solvent whose functional groups do not react with the polyimide precursors. Suitable solvents include N,N-dialkyl carboxylamides such as N,N-dimethyl-formamide, N,N-dimethyl-acetamide, N,N-diethylformamide, N,N-diethylacetamide, N,N-dimethylmethoxyacetamide, N-methyl caprolactam; dimethylsulfoxide, N-methyl-2-pyrrolidinone, tetramethyl urea, pyridine, dimethylsulfone, hexamethylphosphoramide, tetramethylene sulfone, formamide, N-methylformamide, butyrolactone. The solvents can be used alone, in combinations of solvents, or in combination with poorer solvents such as benzene, ethyl acetate, tetrahydrofuran, diglyme, benzonitrile, dioxane, xylene, toluene and cyclohexane. The preferred solvent is N-methyl-2-pyrrolidinone.

In addition to the polyimide precursors, the compositions which form the radiation sensitive polyimide film forming layer typically included a radiation sensitive initiator and sensitizer. However, when electron beam and x-rays are used as the radiation source, the initiator and sensitizer may not be necessary. The preferred initiators include: Irgacure 907, Irgacure 651, and Ciba Geigy CG 25-369. Other initiators include: bis(dialkylamino) benzophenones, e.g., Michler's ketone and 4,4'-bis(diethylamino)benzophenone; other ketones, e.g. 2,5-bis(4'diethylaminobenzal)cyclohexanone, 2,6-bis(4'-dimethylaminobenzal-4-methylcyclohexanone, 2,6-bis(4'-diethylaminobenzal)-4-methylcyclohexanone, 4,4'-bis(dimethylamino)chalcone, 4,4'-bis(diethylamino)chalcone, p-dimethylaminocinnamylideneindanone, p-dimethylaminobenzylideneindanone, 2-(p-dimethylaminophenylvinylene)benzothiazole, 2-(p-dimethylaminophenylvinylene) isonaphthothiazole, 1,3-bis(4'-dimethylaminobenzal)acetone, 1,3-bis-carbonyl-bis(7-diethylaminocoumarin); ethanolamine derivatives, e.g., N-phenyldiethanolamine, N-phenylethanolamine, and N-phenyl-N'-ethylethanolamine; and mercapto-containing aromatic heterocyclic compounds, e.g., 2-mercaptobenzimdazol, 2-mercaptobenzothiazole, and 1-phenyl-5-mercapto-1H-tetrazole. Examples of suitable sensitizers are the thioxanthone derivatives such as those represented by the formula:

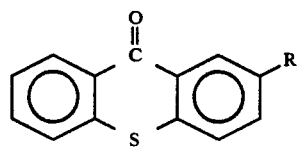

wherein R is isopropyl or propoxy.

Suitable sensitizers are also represented by the folmula:

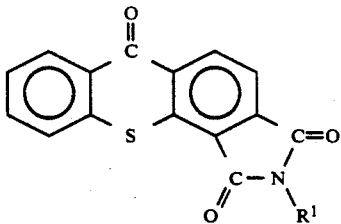

wherein $R^1$ is —C(CH$_3$)$_2$CH$_2$C(CH$_3$)$_3$, —CH$_2$CH$_2$OH, —CH$_2$CH$_2$N(C$_2$H$_5$)$_2$, —CHCH=CH$_2$, —CH$_2$—C≡CH, —CH(CH$_3$)$_2$, or

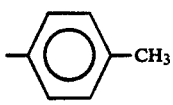

The initiator is usually present in the composition in amounts of about 1% to about 5%, and preferably about 2.5% to about 3% by weight based upon the polyimide precursor. The sensitizer is usually present in the composition in amounts of about 1% to about 5% and preferably about 2.5% to about 3% based upon the polyimide precursor.

Often times, radiation sensitive polyimide film forming compositions also include one or more reactive diluents. Suitable reactive diluents include polyethylenically unsaturated compounds that are capable of reacting upon exposure to radiation such as ultraviolet light, and usually those that contain terminal ethylenic groups. Such compounds include unsaturated esters of polyols and especially esters of the methylene carboxylic acid such as ethylene diacrylate; diethylene glycol diacrylate; glycerol diacrylate; glycerol triacrylate; ethylene dimethacrylate; 1,3-propylene dimethacrylate; 1,2,4-butene triol trimethacrylate; 1,4-benzenediol dimethacrylate; pentaerythritol tetramethacrylate; 1,3-propane diol diacrylate; 1,6-hexane diol diacrylate; the bis-acrylates and methacrylates of polyethylene glycols of molecular weight 200-500; trimethylol propane triacrylate; 2-ethyl-2-(hydroxylmethyl)-1,3 propanediol triacrylate; pentaerythritol triacrylate; unsaturated amides such as those of the methylene carboxylic acids and especially those of alpha, omega-diamines and oxygen-interrupted omega-diamines such as methylene bisacryl and bismethacrylamide; diethylene triamine tris-methacrylamide; bis-(methacrylamidopropoxy) ethane; bis-methacrylamidoethyl methacrylate; N-[(B-hyroxyethyloxy) ethyl] acrylamide; vinyl-esters such as divinyl succinate; divinyl adipate; divinyl phthalate, divinyl terephthalate, divinyl benzene-1,3-disulfonate, and divinyl butane-1,4-disulfonate; and unsaturated aldehydes such as sorbaldehyde. The composition will typically contain about 1% to about 10% and preferably about 2% to about 8% by weight of the reactive diluent based upon the weight of copolyamic acid or derivative thereof.

Figure 3:
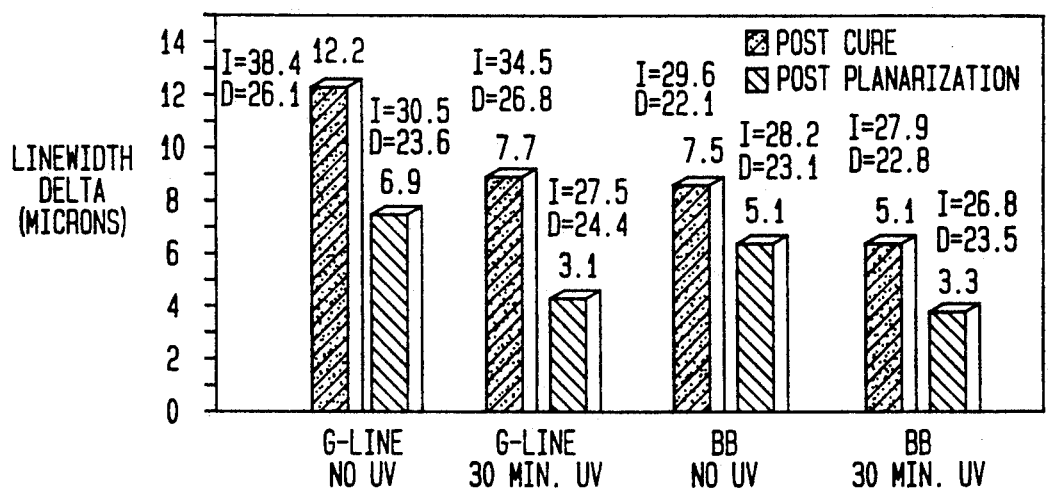
FIG. 3 is a bar graph showing the measured difference in line width between isolated and dense features, with and without the post-develop flood exposure step of the present invention.

FIG. 3 graphically demonstrates the advantages of the post-develop, precure, flood radiation exposure step of the present invention. In FIG. 3, a series of lines were created in 6F, a commercially available photosensitive polyimide film forming material available from Ciba Geigy which is noted above. Some of the lines were isolated while others were densely patterned as discussed above in conjunction with FIG. 1a. The polyimide was then cured with or without a prior flood exposure step and the difference between the measured linewidth for isolated (I) and dense (D) features was determined as the linewidth delta, and this value is plotted on the y-axis. In a first test case, the patterned exposure was done with G-line exposure for thirty minutes at a dosage of 450 mJ/cm$^2$ was used. In a second test case, the patterned exposure was done with broad band (BB) exposure for thirty minutes at a dosage of 500 mJ/cm$^2$ was used. Subsequent to deposition of metallization and planarization, the linewidth delta was measured again. FIG. 3 also indicates the linewidth in microns which was actually measured.

FIG. 3 clearly shows that the linewidth delta after cure is significantly reduced when the polyimide precursor is subjected to a flood radiation exposure prior to curing. This was true even after planarization, suggesting that the sidewall of the unexposed polyimide had a significantly larger profile for the isolated lines than the dense lines. Better results were also observed when the substrates were heated between 70°-175° C. during the flood radiation exposure step. Best results were obtained when the substrates were heated between 80°-120° C. during the post-development flood exposure step. Because pretreating a radiation sensitive polyimide film forming material by exposure to flood radiation prior to curing helps maintain the relative size of isolated and dense features, the procedure could be beneficially used in many integrated circuit and semiconductor manufacturing processes. The precure flood exposure step will help maintain the uniformity of electrical signal propagation properties in components fabricated from radiation sensitive polyimide precursors.

While the invention has been described in terms of its preferred embodiments, those skilled in the art will recognize that the invention can be practiced with modification within the spirit and scope of the appended claims.

Having thus described our invention, what we claim as new and desire to secure by Letters Patent is as follows:

1. A method of retaining the definition of features in a radiation sensitive polyimide film forming composition subsequent to imidization cure, comprising the steps of:

applying a radiation sensitive polyimide film forming composition to a substrate;

patterning said radiation sensitive polyimide film forming composition by imaging and developing to produce a stencil pattern of said radiation sensitive polyimide film forming composition, said stencil pattern having a bottom surface adjacent said substrate and a top surface spaced from said substrate by a first thickness of said radiation sensitive polyimide film forming composition, said stencil pattern having features formed therein by said imaging and developing of said patterning step wherein portions of said stencil pattern cover portions of said substrate and wherein portions of said substrate are not covered by said stencil pattern, said features being defined by sidewalls of said radiation sensitive polyimide film forming composition which extend between said bottom surface and said top surface of said radiation sensitive polyimide film forming composition;

post development exposing said stencil pattern to radiation at an energy level and for a time sufficient to crosslink and harden said radiation sensitive polyimide film forming composition at said sidewalls of said features of said stencil pattern to a point which will reduce the tendency of said sidewalls of said features in said radiation sensitive polyimide film forming composition to retract at said top surface during thermal curing; and thermally curing said radiation sensitive polyimide film forming composition in said stencil pattern to create a patterned polyimide film having a bottom surface adjacent said substrate and a top surface spaced from said substrate by a second thickness which is smaller than said first thickness of said radiation sensitive polyimide film forming composition.

2. A method as recited in claim 1 wherein said step of post development exposing is performed with radiation of all wavelengths in the ultraviolet and visible spectrum.

3. A method as recited in claim 1 wherein said step of post development exposing is performed with radiation at wavelengths ranging from 300 to 500 nanometers.

4. A method as recited in claim 1 further comprising the step of heating aid stencil pattern during said step of post development exposing.

5. A method as recited in claim 4 wherein said step of heating is performed for said time of said post development exposing step.

6. A method as recited in claim 4 wherein said step of heating is performed for part of said time of said post development exposing step.

7. A method as recited in claim 4 wherein said step of heating is performed at a temperature in excess of 100° C. but less than that required for thermal curing.

8. A method as recited in claim 7 wherein said step of heating is performed at a temperature below 100° C.

9. A method as recited in claim 1 wherein said step of post development exposing is performed for a time period up to one hour.

10. A method as recited in claim 1 wherein said step of post development exposing is performed using radiation selected from the group consisting of UV/visible radiation, electron beam, ion beam, and x-rays.

11. A method as recited in claim 1 wherein said step of post development exposing provides an exposure dose of radiation ranging from 200 mJ to 10 J.

12. A method as recited in claim 1 wherein said step of thermally curing is performed at a temperature sufficient to imidize polyimide precursor compounds in said radiation sensitive polyimide film forming composition applied to said substrate.

13. A method as recited in claim 12 wherein said step of thermally curing is performed at a temperature on the order of approximately 400° C.

14. A method as recited in claim 1 wherein said radiation sensitive film forming composition applied during said applying step includes tetracarboxylic acid dianhydrides and diamines.

15. A method as recited in claim 1 further comprising the step of baking said radiation sensitive polyimide film forming composition prior to said step of patterning.

16. A method as recited in claim 1 wherein said patterning step produces a stencil pattern with both isolated and dense features wherein each of said isolated features are separated from other isolated or dense features in said stencil pattern by more than 100 microns and each of said dense features are separated from other isolated or dense features by less than 100 microns, and wherein said post development exposing step is sufficient to reduce differences in relative retraction of said sidewalls at said top surface of said radiation sensitive polyimide film forming composition between said isolated and dense features.

* * * * *